United States Patent
Zhou et al.

(10) Patent No.: US 9,148,949 B2
(45) Date of Patent: Sep. 29, 2015

(54) ELECTRONIC TEXTILE AND METHOD OF MANUFACTURING AN ELECTRONIC TEXTILE

(75) Inventors: Guofu Zhou, Best (NL); Johannes Adrianus Maria Rademakers, Vessem (NL); Petrus Antonius Henricus Snoeijen, Leende (NL); Josephus Henricus Gerardus Bax, Luyksgestel (NL); Frank Anton Van Abeelen, Eindhoven (NL); Liesbeth Van Pieterson, Heeze (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 13/822,642

(22) PCT Filed: Sep. 6, 2011

(86) PCT No.: PCT/IB2011/053890
§ 371 (c)(1),
(2), (4) Date: Mar. 13, 2013

(87) PCT Pub. No.: WO2012/038849
PCT Pub. Date: Mar. 29, 2012

(65) Prior Publication Data
US 2013/0176737 A1 Jul. 11, 2013

(30) Foreign Application Priority Data
Sep. 21, 2010 (EP) .................................... 10177985

(51) Int. Cl.
| *H05B 33/00* | (2006.01) |
| *H01L 51/50* | (2006.01) |
| *H05K 1/02* | (2006.01) |
| *H05K 1/03* | (2006.01) |
| *H05K 1/18* | (2006.01) |
| *F21V 21/00* | (2006.01) |
| *H05K 3/30* | (2006.01) |
| *H05K 3/32* | (2006.01) |

(52) U.S. Cl.
CPC .............. *H05K 1/0277* (2013.01); *F21V 21/00* (2013.01); *H05K 1/0283* (2013.01); *H05K 1/038* (2013.01); *H05K 1/189* (2013.01); *H05K 3/303* (2013.01); *H05K 3/321* (2013.01); *H05K 2201/029* (2013.01); *H05K 2201/0281* (2013.01); *H05K 2201/10106* (2013.01); *H05K 2203/0152* (2013.01); *Y10T 29/4913* (2015.01)

(58) Field of Classification Search
CPC .............. D03D 1/0082; D03D 1/0088; D03D 2700/166; D10B 2401/18; D10B 2403/02431; A41D 1/005; A41D 1/002; H05K 2201/029; H05K 2201/0281; H05K 1/0366; H05K 1/038; H05K 1/0283
See application file for complete search history.

(56) References Cited

U.S. PATENT DOCUMENTS

| 8,282,232 B2 * | 10/2012 | Hsu et al. ....................... 362/103 |
| 2003/0211797 A1 * | 11/2003 | Hill et al. ....................... 442/205 |
| 2004/0244193 A1 * | 12/2004 | Jung et al. ........................ 29/854 |
| 2006/0035554 A1 * | 2/2006 | Glaser et al. ................... 442/301 |
| 2006/0258205 A1 * | 11/2006 | Locher et al. ................. 439/517 |
| 2011/0073353 A1 * | 3/2011 | Lee et al. ....................... 174/254 |
| 2013/0033879 A1 * | 2/2013 | Vicard et al. .................. 362/382 |

FOREIGN PATENT DOCUMENTS

| EP | 1814369 A1 | 8/2007 |
| EP | 2020831 A1 | 2/2009 |
| GB | 2396252 A | 10/2002 |
| JP | 2001052856 A | 2/2001 |
| WO | 2008001250 A1 | 1/2008 |
| WO | 2010033902 A2 | 3/2010 |

OTHER PUBLICATIONS

E.R. Post, M. Orth, P.R. Russo, N. Gershenfeld. "E-broidery: Design and Fabrication of Textile-Based Computing." IBM Systems Journal, 2000, vol. 39, Issue: 3.4, pp. 840-860, Yorktown Heights, NY.

*Primary Examiner* — Mariceli Santiago

(57) ABSTRACT

A method of manufacturing an electronic textile (1) comprising the steps of: providing a textile carrier (2) comprising a plurality of conductor lines (6*a-b*); releasably attaching (101) the textile carrier (2) to a rigid support plate (20); providing (102) a conductive substance on the textile carrier (2) in a pattern forming a plurality of sets of connection pads (5*a-b*) on the textile carrier (2), each set of connection pads defining a component placement position for placement of an electronic component (3), and each set of connection pads (5*a-b*) comprising a connection pad overlapping one of the conductor lines, the connection pad having a connection pad length ($L_{cp}$) in a direction parallel to the conductor line and a connection pad width ($W_{cp}$) in a direction perpendicular to the conductor line, wherein the connection pad width ($W_{cp}$) is at least one percent of an extension ($W_{tc}$) of the textile carrier (2) in the direction perpendicular to the conductor line; automatically placing (103) electronic components (3) at the component placement positions; curing (104) the conductive substance to attach the electronic components (3) to the textile carrier (2), thereby forming the electronic textile (1) and removing (105) the electronic textile from the rigid support plate.

7 Claims, 3 Drawing Sheets

ELECTRONIC TEXTILE AND METHOD OF MANUFACTURING AN ELECTRONIC TEXTILE

FIELD OF THE INVENTION

The present invention relates to an electronic textile, and to a method of manufacturing such an electronic textile.

BACKGROUND OF THE INVENTION

Many types of textiles are used in our every-day life. When electronics are unobtrusively integrated into these textiles to create electronic textiles, new application fields emerge. One such example of a new application is light-emitting textiles, and other examples include textile-based sensing systems, wearable electronics etc.

For these new applications, the very special properties of a textile, such as the conformability and/or stretchability that can be achieved with a textile are advantageous. However, the very same properties as well as irregularities in the textile resulting from the manufacturing process translate to challenges faced in the process of devising a process for manufacturing an electronic textile. For example, it has turned out to be difficult to mount electronic components on a textile substrate in a reliable and cost-efficient manner.

Various methods for mounting electronic components to a textile substrate have been proposed. However, most of these methods are labor intensive and are not suitable for mass-production, at least not without extensive investment in new types of manufacturing equipment.

WO-2010/033902 discloses one example of a method for mounting electronic components to a textile substrate on an industrial scale. According to this method, a moving textile substrate is temporarily clamped between clamps to stabilize a site for mounting an electronic component. Subsequently, the electronic component, in a special two-part package, is snapped in place, and thereafter the electronic component may be more permanently and reliably joined to the textile substrate with epoxy.

Although appearing to be able to handle a high production rate, the method disclosed by WO-2010/033902 seems to require a special type of electronic component package and utilizes a connection technique which is not a standard in the electronics manufacturing industry. Accordingly, substantial investment would be required to use the method of WO-2010/033902 and it would be possible to use only custom made component packages, which increases the cost of the electronic textile.

SUMMARY OF THE INVENTION

In view of the above-mentioned and other drawbacks of the prior art, a general object of the present invention is to enable a more cost-efficient production of electronic textiles.

According to a first aspect of the present invention there is provided a method of manufacturing an electronic textile comprising the steps of: providing a textile carrier comprising a plurality of conductor lines; releasably attaching the textile carrier to a rigid support plate; providing a conductive substance on the textile carrier in a pattern forming a plurality of sets of connection pads on the textile carrier, each set of connection pads defining a component placement position for placement of an electronic component, and each set of connection pads comprising a connection pad overlapping one of the conductor lines, the connection pad having a connection pad length in a direction parallel to the conductor line and a connection pad width in a direction perpendicular to the conductor line, wherein the connection pad width is at least one percent, but preferably at least two percent, of an extension of the textile carrier in the direction perpendicular to the conductor line; automatically placing electronic components at the component placement positions; curing the conductive substance to attach the electronic components to the textile carrier, thereby forming the electronic textile; and removing the electronic textile from the rigid support plate.

By "textile" should, in the context of the present application, be understood a flexible material or product that is wholly or partly made of fibers. The fibers may be provided in the form of single fibers/filaments, or maybe bundled together in a multi-fiber configuration, such as a yarn. The textile may, for example, be manufactured by means of weaving, braiding, knitting, crocheting, quilting, or non-woven techniques like felting.

The "component pads" of the electronic components are pads that are intended and designed for electrically conductive connection to corresponding pads on a circuit board or other component carrier.

Because of the distinct mechanical properties of a textile, it has previously been believed that electronic components could not be mounted on a textile carrier using automatic surface mount component placement equipment, such as so-called "pick-and-place" machines, designed for conventional rigid surface boards. Instead, the focus in the field of manufacturing electronic textiles has been on the development of packages, processes and equipment especially designed for the production of electronic textiles. Now, the present inventors have surprisingly found that automatic surface mount component placement equipment, such as so-called "pick-and-place" machines, can indeed be used for producing electronic textiles with an acceptable reliability and production yield if the textile carrier is releasably attached to a rigid support plate and conductive substance is provided on the textile carrier in an appropriately designed pattern prior to component placement. In particular, the present inventors have found that the size of the connection pads in the direction perpendicular to the conductor lines is crucial to the reliability and production yield, due to the inaccuracy in conductor line positioning resulting from the manufacturing of the textile carrier and the deformation of the textile carrier that may occur when the textile carrier is releasably attached to the rigid support plate. The inventors have found that these mechanisms result in an inaccuracy in the position of a conductor line in the direction perpendicular to the conductor line that is related to the extension of the textile carrier in the direction perpendicular to that conductor line. By relating the connection pad width of a connection pad arranged on a conductor line to the extension of the textile carrier in the direction perpendicular to that conductor line, the above-mentioned inaccuracy can be compensated for. The present inventors have found that it is generally sufficient to provide the conductive substance such that the connection pad width is at least one percent, but preferably at least two percent, of the extension of the textile carrier in the direction perpendicular to the conductor line. Moreover, the connection pad width may be at least equal to the component pad width of the component pad to be connected to the connection pad.

To further increase the reliability and/or production yield of the method according to the present invention, the conductive substance may be provided such that the connection pad length becomes at least equal to the component pad length.

The rigid support plate may advantageously be provided with reference markers for guiding placement of the textile carrier and for allowing alignment of the automatic placement equipment. Such reference markers may, for example, comprise lines for aligning the textile carrier when releasably attaching the textile carrier to the rigid support plate and/or crosses or similar to be used as fiducial marks by the automatic placement equipment.

According to various embodiments of the method according to the present invention, the step of releasably attaching may comprise the steps of tensioning the textile carrier; and pressing the textile carrier against an adhesive layer provided on the rigid support plate.

By tensioning the textile carrier, any wrinkles etc. can be removed and a flat surface be formed.

Furthermore, the rigid support plate may comprise mutually spaced apart support plate apertures, and the step of releasably attaching may comprise the steps of: providing a rigid alignment arrangement comprising an alignment plate and mutually spaced apart alignment pins extending substantially perpendicularly from the alignment plate, the alignment pins being arranged to correspond to an arrangement of the support plate apertures of the rigid support plate; tensioning the textile carrier and arranging the textile carrier on the rigid alignment plate such that the alignment pins penetrate the textile carrier; aligning the rigid support plate to the alignment pins and sandwiching the textile carrier between the rigid support plate and the rigid alignment plate such that textile carrier is releasably attached to the rigid support plate.

Through the provision of this rigid alignment plate and the above-mentioned configurations of the rigid support plate and the textile carrier, alignment of the textile carrier in relation to the rigid support plate is facilitated. In particular, textile carrier apertures or other indicators may be arranged at precisely defined positions in relation to the conductor lines of the textile carrier, which means that the positions of the conductor lines will be available to the automatic electronic component placement equipment following calibration/alignment in respect to the rigid support plate.

According to various embodiments of the method according to the present invention, the step of providing the conductive substance may comprise the step of dispensing conductive glue in the pattern. The pattern of connection pads may, for example, be formed by a conventional low-temperature solder paste or conductive glue. Experiments have shown, however, that conductive glue is currently preferable since better contact can be established between the electronic components and the conductor lines, in particular when the conductor lines are formed by conductive yarns.

According to a second aspect of the present invention, there is provided an electronic textile comprising: a textile carrier having a plurality of conductor lines; a plurality of connection pads, each overlapping one of the conductor lines and having a connection pad length in a direction parallel to the conductor line and a connection pad width in a direction perpendicular to the conductor line; and a plurality of electronic components each having at least a first component pad being electrically connected to one of the conductor lines via one of the connections pads, wherein the connection pad width is at least one percent, but preferably at least two percent, of an extension of the textile carrier in the direction perpendicular to the conductor line.

Variations and advantages of this second aspect of the present invention are largely analogous to those provided above in connection with the first aspect of the invention.

For example, the connection pad length may be at least equal to the component pad length.

Furthermore, the connection pads may be formed by conductive glue.

Moreover, the textile carrier may advantageously comprise a plurality of interwoven conductive yarns and non-conductive yarns, the plurality of conductor lines being formed by conductive yarns.

In various embodiments, furthermore, the plurality of electronic components may comprise at least one light-emitting diode.

BRIEF DESCRIPTION OF THE DRAWINGS

These and other aspects of the present invention will now be described in more detail, with reference to the appended drawings showing currently preferred embodiments of the invention, wherein:

FIG. 1b is a schematic cross-section view of the electronic textile in FIG. 1a;

DETAILED DESCRIPTION OF THE EMBODIMENTS

Figure 1A:
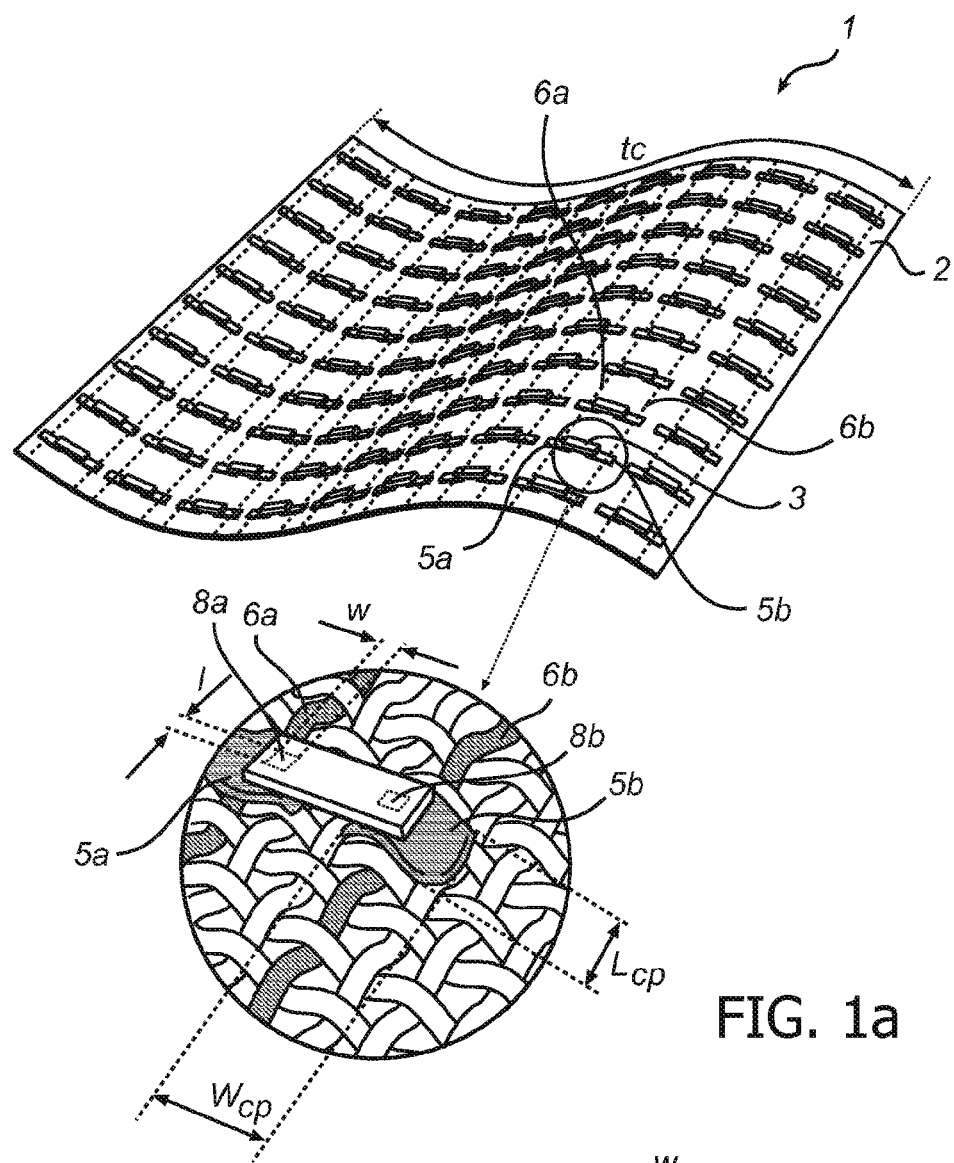
FIG. 1a schematically illustrates an electronic textile according to an exemplary embodiment of the present invention.

FIG. 1a schematically illustrates an exemplary electronic textile 1 comprising a textile carrier 2 and a plurality of electronic components, here in the form of light-emitting diodes (LEDs) 3 (only one of these is indicated in the drawing to avoid cluttering the drawing). In the exemplary embodiment shown in FIGS. 1a-b, the textile carrier 2 is provided in the form of a woven fabric comprising interwoven conductive yarns and non-conductive yarns.

On the textile carrier 2, a plurality of sets of connection pads 5a-b are provided such that a first connection pad 5a overlaps a first conductor line 6a, and the second connection pad 5b overlaps a second conductor line 6b, which is substantially parallel with the first conductor line 6a (again, only one set of connection pads and associated conductor lines are indicated in the drawing to avoid cluttering the drawing). Each LED 3 is electrically connected to a pair of conductor lines 6a-b. The conductor lines may be interrupted at one or more positions. Often, between two consecutive LEDs one of the conductor lines is interrupted, alternately the first and the second conductor line. This allows the LEDs to be connected in series via an associated set of connection pads 5a-b, as is schematically shown in the enlarged portion of the electronic textile 1 shown in FIG. 1a.

As is indicated in the enlarged portion of FIG. 1a, each electronic component 3 comprises a first component pad 8a that is connected to the first conductor line 6a via the first connection pad 5a, and a second component pad 8b that is connected to the second conductor line 6b via the second connection pad 5b.

Figure 1B:
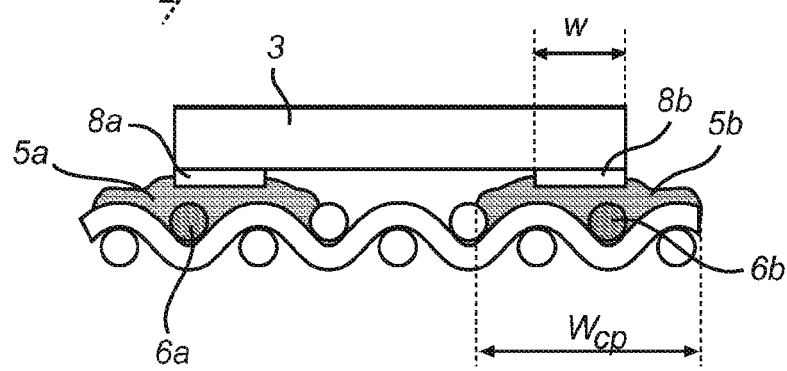

Each connection pad 5a-b has a connection pad width $W_{cp}$, and a connection pad length $L_{cp}$, and each component pad 8a-b has a component pad width w and a component pad length l. Furthermore, as is indicated in FIG. 1a, the textile carrier 2 has an extension $W_{tc}$ in the direction perpendicular to the conductor lines 6a and 6b. To provide for automatic manufacturing with high yield of the electronic textile 1, the width $W_{cp}$ of the connection pads 5a-b is at least one percent of the extension $W_{tc}$ of the textile carrier 2 in the direction perpendicular to the conductor lines 6a and 6b. Preferably, the width $W_{cp}$, of the connection pads 5a-b is at least two percent of the extension $W_{tc}$ of the textile carrier 2 in the direction perpendicular to the conductor lines 6a and 6b. This typically means that the connection pads 5a-b are considerably larger than their associated component pads 8a-b. In the example that is illustrated by FIGS. 1a-b, the connection pad length $L_{cp}$ is greater than the component pad length l, and as can best be seen in FIG. 1b, which is a cross-section view of the enlarged portion of the electronic textile 1 in FIG. 1a, the connection pad width $W_{cp}$ is more than two times the component pad width w.

Through this particular dimensioning, the inventors have found that the electronic textile 1 can be manufactured using automatic component placement equipment otherwise used for placing components on rigid printed circuit boards with a sufficiently high production yield. This is possible, since the dimensional tolerances due to inaccuracies of the textile carrier 2 are compensated for by the "oversized" connection pads 5a-b.

Figure 2:
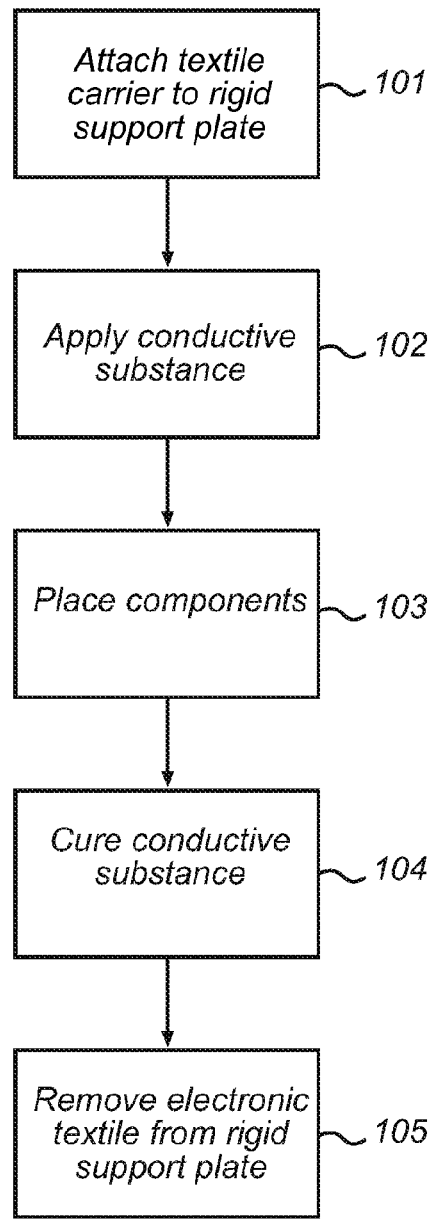
FIG. 2 is a flow-chart schematically illustrating an embodiment of the method according to the present invention.

An exemplary method of manufacturing the electronic textile 1 described above in connection with FIGS. 1a-b will now be described with reference to FIG. 2.

In the first step 101, the textile carrier 2 is releasably attached to a rigid support plate. Two exemplary ways of carrying out this step will be described further below with reference to FIGS. 3 and 4.

Following the attachment of the textile carrier to the rigid support plate, a conductive substance is applied to form the connection pads in step 102. The conductive substance may, for example, be a solder paste or a conductive glue, and may be applied in any suitable manner, such as screen printed or dispensed.

Subsequently, in step 103, the electronic components are automatically placed at component placement positions defined by the connection pads provided in step 102.

Thereafter, in step 104, the conductive substance is cured, which may, for example, be done by placing the textile carrier, with the electronic components loosely attached thereto by the conductive substance, and still attached to the rigid support plate, in an oven.

Finally, in step 105, the finished electronic textile is removed from the rigid support plate.

Two exemplary ways of carrying out the above-mentioned step 101 of releasably attaching the textile carrier 2 to a rigid support plate 20 will now be described with reference to FIGS. 3 and 4.

Figure 3:
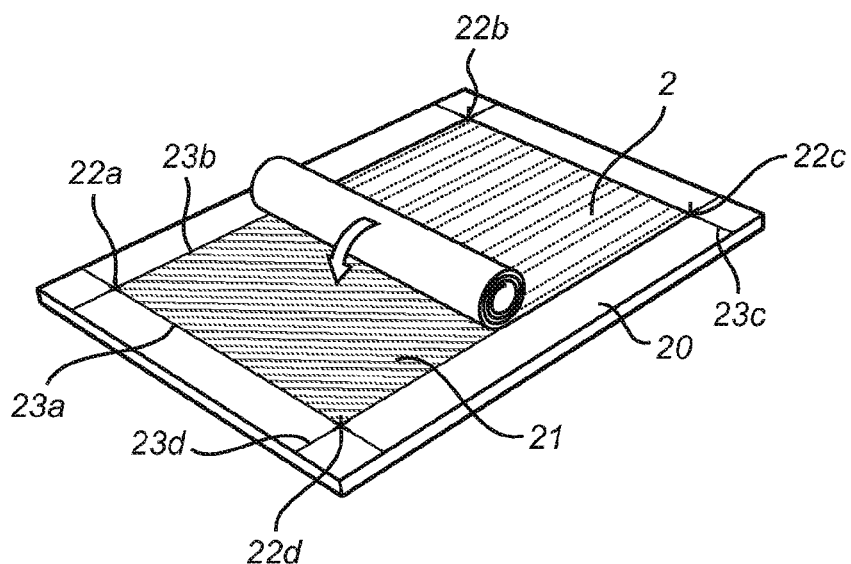
FIG. 3 is a schematic illustration of certain steps of a method according to a first exemplary embodiment of the method according to the present invention.

According to the first exemplary way, as is schematically shown in FIG. 3, the rigid support plate 20 is provided with easy-to-detach adhesive in an area 21 substantially corresponding to the extension of the textile carrier 2. The rigid support plate 20 is further provided with reference markers (sometimes also referred to as fiducials) 22a-d for allowing alignment of the automatic placement equipment, and guides 23a-d for assisting in the alignment of the textile carrier 2 relative to the fiducials 22a-d.

As is schematically shown in FIG. 3, the textile carrier is aligned with the guides 23a-d and pressed flat against the area 21 with the adhesive. As indicated in FIG. 3, the textile carrier 2 may be rolled out, but of course other ways of attaching the textile carrier to the rigid support plate 20 are possible.

After the textile carrier has been aligned with the guides 23a-d and pressed flat against the rigid support plate 20 to remove any wrinkles (a procedure which may typically involve more or less tensioning of the fabric of the textile carrier 2), the textile carrier-support plate assembly is ready for the step 102 of applying the conductive substance.

Figure 4:
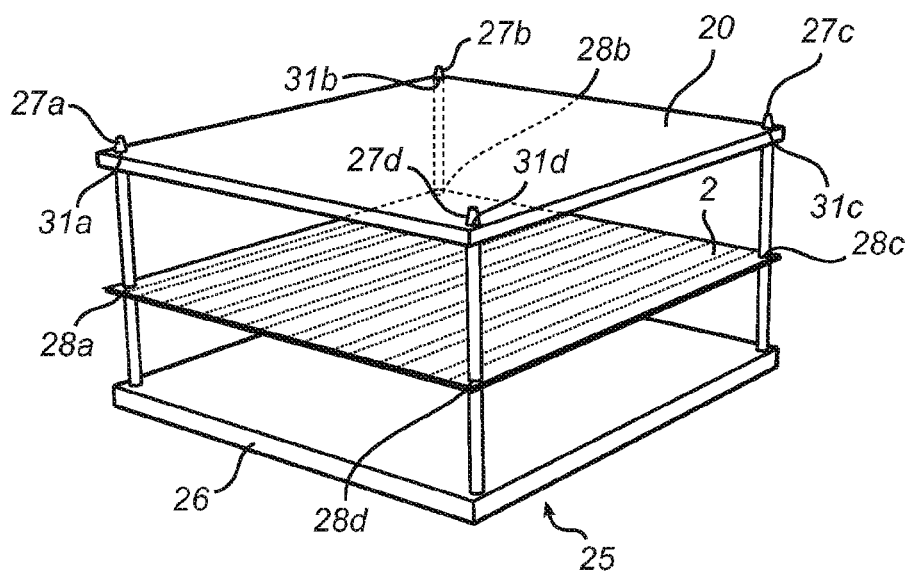
FIG. 4 is a schematic illustration of certain steps of a method according to a second exemplary embodiment of the method according to the present invention.

According to the second exemplary way, as is schematically shown in FIG. 4, there is provided a rigid alignment arrangement 25 comprising an alignment plate 26 and four mutually spaced apart alignment pins 27a-d that extend substantially perpendicularly from the rigid alignment plate 26.

The textile carrier 2 comprises, as can be understood from FIG. 4, four spaced apart textile carrier apertures 28a-d that are arranged with mutual spacings corresponding to the alignment pins 27a-d, and the rigid support plate 20 with an easy-to-detach adhesive provided thereon (on the side thereof facing the textile carrier 2) is provided with four spaced apart support plate apertures 31a-d that are also arranged with mutual spacings corresponding to the alignment pins 27a-d. The textile carrier apertures may be formed by penetration of the alignment pins though the textile. The textile carrier may have markers at the positions where the alignment pins should penetrate.

As is schematically illustrated in FIG. 4, the above-mentioned step of releasably attaching the textile carrier 2 to the rigid support plate is carried out by tensioning the textile carrier 2 and inserting the alignment pins 27a-d into the textile carrier apertures 28a-d, and then also inserting the alignment pins 27a-d into the support plate apertures 31a-d. Thereafter, the support plate 20 is pressed against the alignment plate 26 so that the textile carrier 2 is sandwiched therebetween and thus releasably attached to the adhesive provided on the rigid support plate 20.

Thereafter, the textile carrier-support plate assembly is ready for the step 102 of applying the conductive substance.

Additionally, variations to the disclosed embodiments can be understood and effected by the skilled person in practicing the claimed invention, from a study of the drawings, the disclosure, and the appended claims. For example, the textile carrier may comprise conductor lines extending in more than one direction, such as horizontal and vertical conductor lines. Electronic components may be connected between, for instance, one horizontal and one vertical conductor line. Moreover, the connection and component pads need not be rectangular, but can be of any shape.

In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

The invention claimed is:

1. A method of manufacturing an electronic textile comprising the steps of:
providing a textile carrier comprising a plurality of conductor lines (6a-b);
releasably attaching said textile carrier to a rigid support plate;
providing a conductive substance on said textile carrier in a pattern forming a plurality of sets of connection pads (5a-b) on said textile carrier, each set of connection pads defining a component placement position for placement of an electronic component, and each set of connection pads (5a-b) comprising a connection pad overlapping one of said conductor lines, said connection pad having a connection pad length ($L_{cp}$) in a direction parallel to said conductor line and a connection pad width ($W_{cp}$) in a direction perpendicular to said conductor line, wherein said connection pad width ($W_{cp}$) is at least one percent of an extension ($W_{tc}$) of said textile carrier in said direction perpendicular to the conductor line;

automatically placing electronic components at said component placement positions, whereby the connecting pads in the resulting structure are positioned between the corresponding conductor line and the electronic component;

curing said conductive substance to attach said electronic components to said textile carrier, thereby forming said electronic textile; and removing said electronic textile from said rigid support plate.

2. The method according to claim 1, wherein each of said electronic components has at least a first component pad (8a) having a component pad length (1) in a direction parallel to said conductor line (6a) and a component pad width (w) in a direction perpendicular to said conductor line (6a), and said connection pad width ($W_{cp}$) is at least equal to said component pad width (w) of the component pad (8a) to be connected to said connection pad (5a)

wherein said automatically placing step comprises positioning said first component pad adjacent to said connection pad.

3. The method according to claim 2, wherein said conductive substance is provided such that said connection pad length ($L_{cp}$) becomes at least equal to said component pad length (l).

4. The method according to claim 1, wherein said rigid support plate is provided with reference markers (22a-d; 23a-d) for guiding placement of said textile carrier and for allowing alignment of the automatic placement equipment.

5. The method according to claim 1, wherein said step of releasably attaching comprises the steps of: tensioning said textile carrier; and pressing said textile carrier against an adhesive layer provided on said rigid support plate.

6. The method according to claim 5, wherein said rigid support plate comprises mutually spaced apart support plate apertures (31a-d), and wherein said step of releasably attaching comprises the steps of:

providing a rigid alignment arrangement comprising an alignment plate and mutually spaced apart alignment pins (27a-d) extending substantially perpendicularly from said alignment plate, said alignment pins being arranged to correspond to an arrangement of the support plate apertures (31a-d) of said rigid support plate;

tensioning said textile carrier and arranging said textile carrier on said rigid alignment plate such that said alignment pins penetrate said textile carrier;

aligning said rigid support plate to said alignment pins and sandwiching said textile carrier between the rigid support plate and the rigid alignment plate such that said textile carrier is releasably attached to the rigid support plate.

7. The method according to claim 1, wherein said step of providing said conductive substance comprises the step of: dispensing conductive glue in said pattern.

* * * * *